(12) United States Patent
Magnavacca et al.

(10) Patent No.: US 7,710,772 B2
(45) Date of Patent: May 4, 2010

(54) METHOD OF MANAGING A MULTILEVEL MEMORY DEVICE AND RELATED DEVICE

(76) Inventors: Alessandro Magnavacca, Via Leopardi, 241/D, 20099 Sesto San Giovanni (IT); Francesco Pipitone, Corso Calatafimi, 553, 90129 Palermo (IT); Carlo Lisi, Via Anfossi, 28, 20135 Milano (IT); Antonio Geraci, Via L. Modorati, 1, 20052 Monza (IT)

( * ) Notice: Subject to any disclaimer, the term of this patent is extended or adjusted under 35 U.S.C. 154(b) by 129 days.

(21) Appl. No.: 12/109,525

(22) Filed: Apr. 25, 2008

(65) Prior Publication Data

US 2008/0266946 A1 Oct. 30, 2008

(30) Foreign Application Priority Data

Apr. 27, 2007 (IT) ............................ VA2007A0042

(51) Int. Cl.
*G11C 11/34* (2006.01)
(52) U.S. Cl. .............................. 365/185.03; 365/185.11
(58) Field of Classification Search ............ 365/185.03, 365/185.11, 185.12
See application file for complete search history.

(56) References Cited

U.S. PATENT DOCUMENTS

| | | | | |
|---|---|---|---|---|
| 5,838,610 A | * | 11/1998 | Hashimoto | 365/168 |
| 5,973,958 A | * | 10/1999 | Parker | 365/185.03 |
| 6,208,542 B1 | * | 3/2001 | Wang et al. | 365/45 |

* cited by examiner

*Primary Examiner*—Anh Phung
(74) *Attorney, Agent, or Firm*—Schwabe, Williamson & Wyatt, P.C.

(57) ABSTRACT

A memory has an array of k-level cells, organized into pages of words, each storing a string of bits. The memory device includes a coding circuit input with strings of N bits, and generates corresponding k-level strings. A program circuit is input with the k-level strings to stores in groups of c cells with k levels. A read circuit reads data stored in groups of c cells with k levels and generates k-level strings. A read decoding circuit is input with k-level strings read from groups of c cells with k levels to generate strings of N bits. The words of each page are grouped in groups of words, each word including groups of c cells with k levels, and at least one remaining bit of the word being stored, with corresponding remaining bits of other words of the page, in a group of c cells with k levels.

18 Claims, 6 Drawing Sheets

W8ET implementation

МETHOD OF MANAGING A MULTILEVEL MEMORY DEVICE AND RELATED DEVICE

FIELD OF THE INVENTION

This invention relates in general to semiconductor memory devices, and, more particularly to a method of managing a memory that employs k-level cells and a related memory device.

BACKGROUND OF THE INVENTION

In a multi-level memory device cells generally assume more than two logic states and thus may store information of more than one bit. A multi-level memory device that occupies a silicon area slightly larger than that of a four-level memory device of the same storage capacity is described in the Italian patent application VA2006A000065, assigned to the current assignee. It employs three-level cells whereby each pair of cells is to store a string of three bits and comprises a coding circuit and a decoding circuit for converting, in a write operation, the strings of three bits to be stored, in strings of two ternary values to be written in respective pairs of three-level cells, and vice versa during a read operation.

There may be three possible states of each cell, thus the relative distributions of the three different read thresholds can be relatively farther away from the voltage levels at which the known "read disturb" and "retention" phenomena (discussed in the above cited prior Italian patent application) are more severe.

A method of managing a multi-level memory device that addresses the issues caused by an accidental interruption or supply voltage drop of a magnitude capable of stopping an ongoing program operation that could take place during programming and that may render the memory device usable as if it were a two-bit memory device, is also disclosed in the above cited prior Italian patent application.

According to the three-level memory device disclosed in the prior application, each cell may assume one of three possible logic values, with the advantage of an area occupation significantly smaller than that of a common one-bit-per-cell memory device, though with a reduced number of threshold voltage distributions than a two-bit-per-cell memory device. This may make unnecessary error correction code techniques, that may otherwise be indispensable with present day technology two-bit per cell devices for ensuring an acceptable reliability, and thus the consequent limitations in terms of "bit manipulation" that the use of ECC technique may impose.

Figure 1:
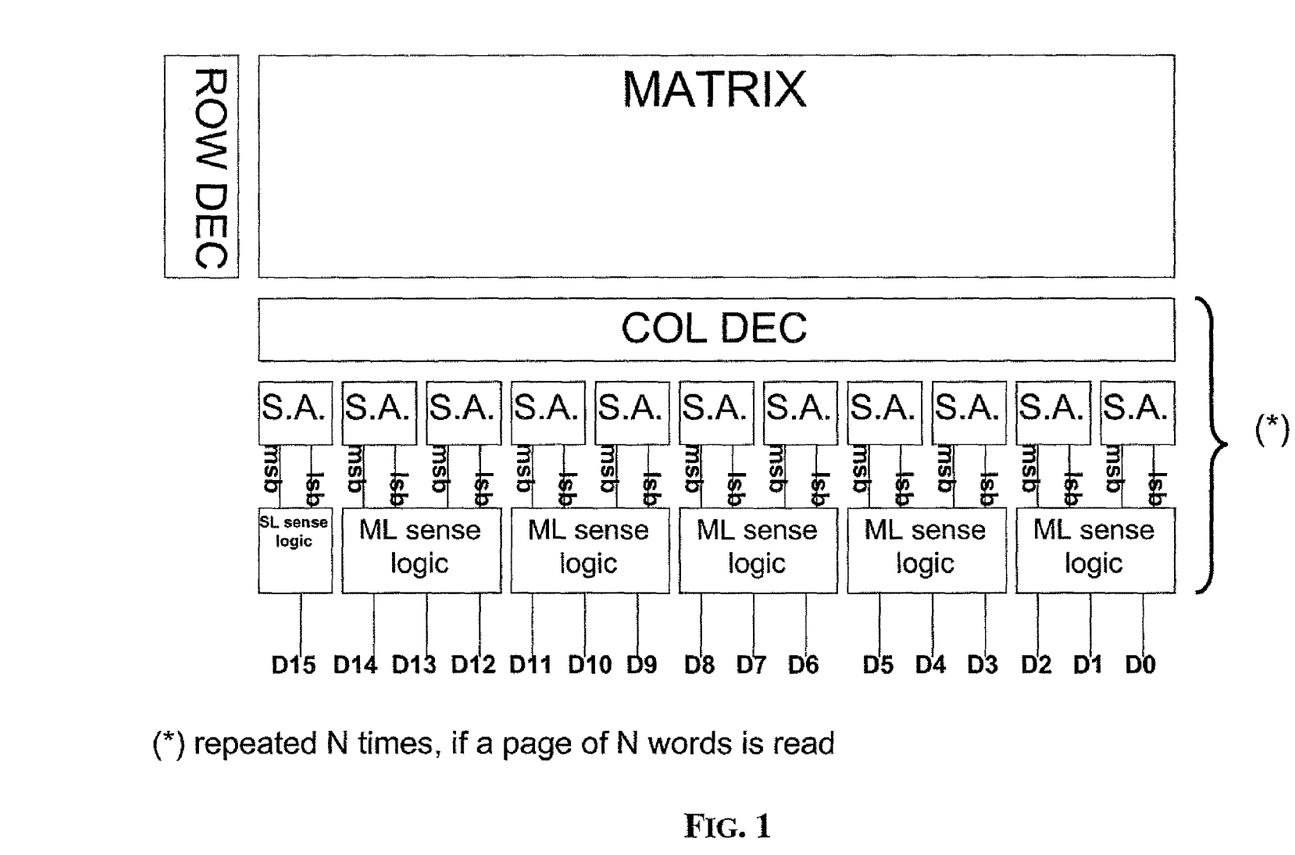
FIG. 1 depicts an architecture of a memory device in which data stored in three-level cells are read in words of sixteen bits, in accordance with the prior art.

An architecture of the memory device according to the cited prior application is schematically depicted in FIG. 1.

SUMMARY OF THE INVENTION

Figure 2:
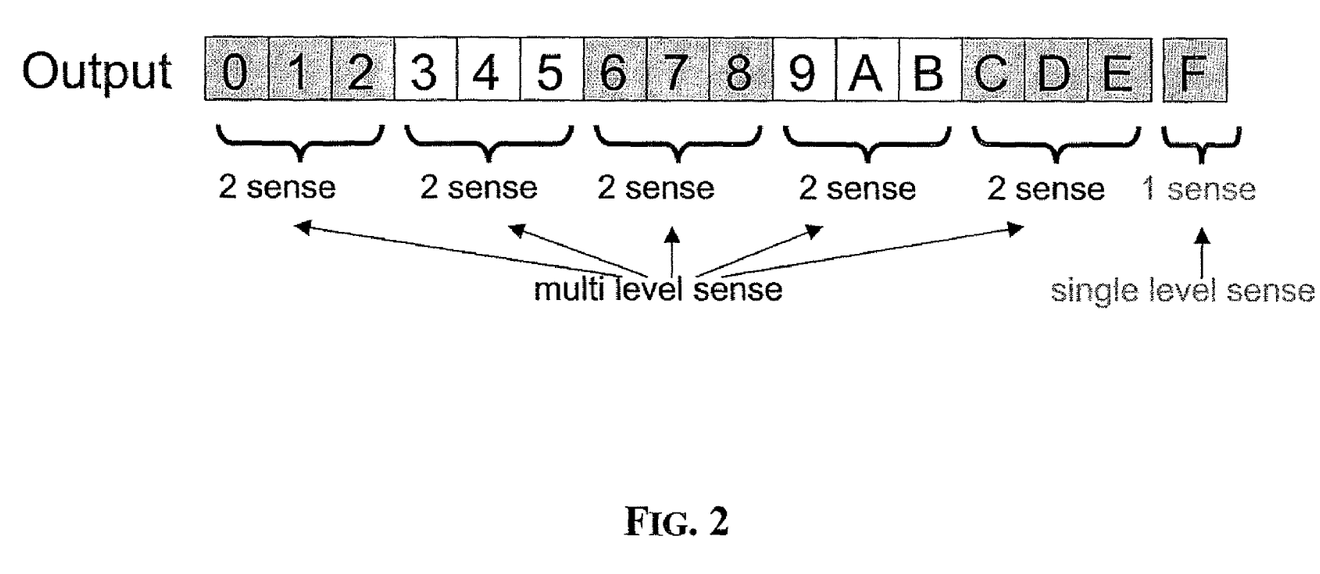
FIG. 2 illustrates a sample coding of a word including 16 bits in eleven three-level-cells, in accordance with the prior art.

Generally, the base element of information of a FLASH memory device is the word that commonly includes 16 bits. To store 16 bits, according to a preferred grouping scheme of the present approach depicted in FIG. 2, five pairs of three-level cells are used, with the remainder of one bit that conveniently but not necessarily may be the most significant or the least significant bit, being stored in an eleventh cell destined to store such a remaining single bit. In practice, this last cell may assume only two of the three possible levels.

Figure 3:
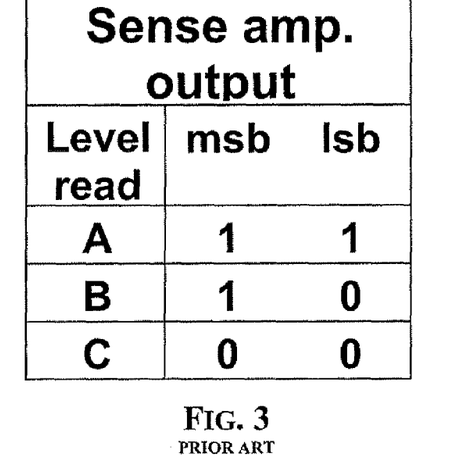
FIG. 3 illustrates an example of decoding of the program levels of a three-level-cell in a pair of bits MSB, LSB, in accordance with the prior art.

One of skill in the art will recognize that it is not necessary that the single bit be stored in the three-level cell destined to store a single bit be the most significant or the least significant bit, but that it can be another bit of the word. Referring to the scheme of FIG. 2, if for example, the bit 9 is stored in a single three-level cell, then the bits 0 to 8 are grouped in triplets as illustrated, and the remaining two triplets of bits may be A, B, C and D, E, F are stored in respective pairs of three-level cells. The three-level memory device as depicted in FIG. 1, has an array of sense amplifiers S.A., each associated with a respective three-level cell of the word to be read and generating two bits, namely: MSB and LSB, representative of the program level of the cell, preferably according to the coding scheme of FIG. 3.

Differently from a classic device, the memory device may have for each word that comprises a page to be read an array of five logic decoding circuits ML SENSE LOGIC, each associated with a respective pair of three-level cells, plus another logic decoding circuit SL SENSE LOGIC, associated with the three-level cell destined to store a single bit.

Figure 4:
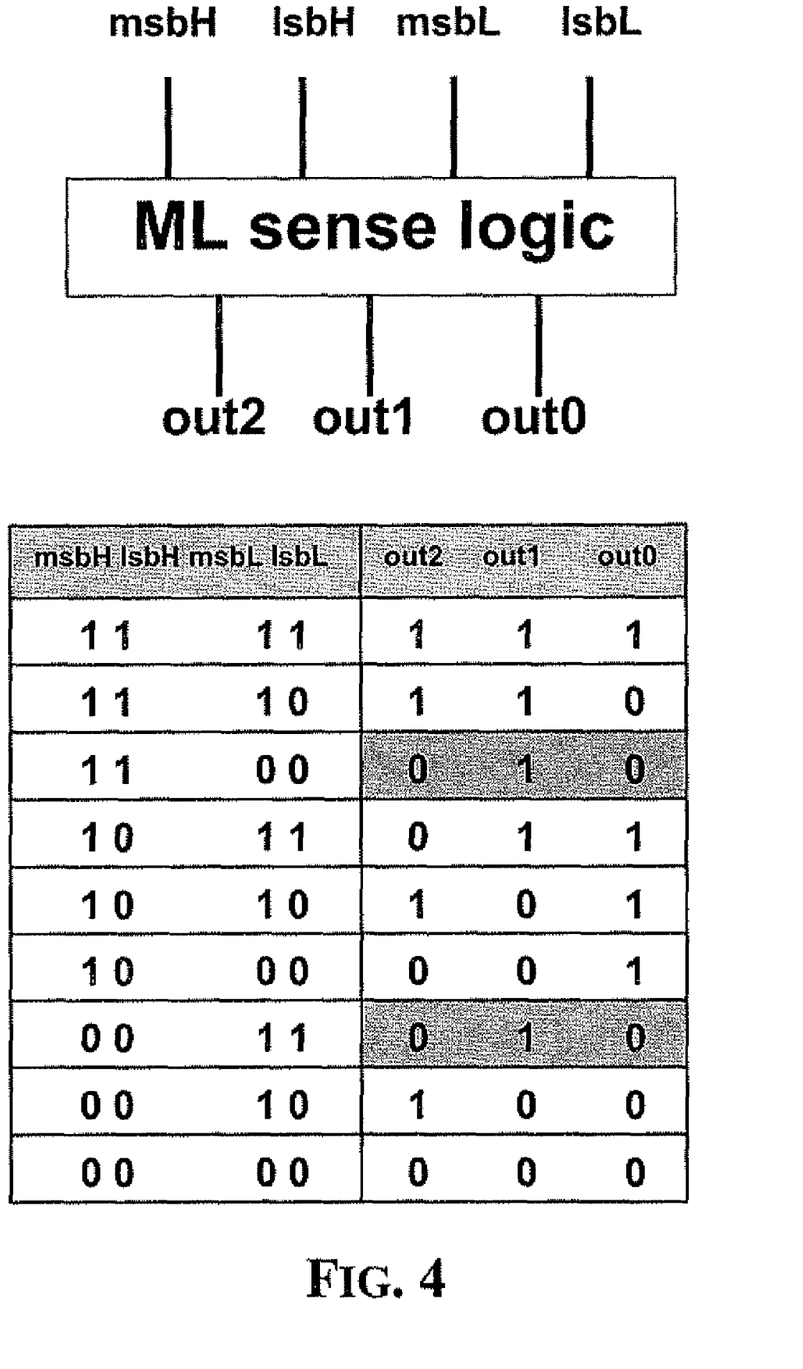
FIG. 4 illustrates how a stored triplet of bits is decoded into a respective pair of three-level cells, in accordance with the prior art.
Figure 5:
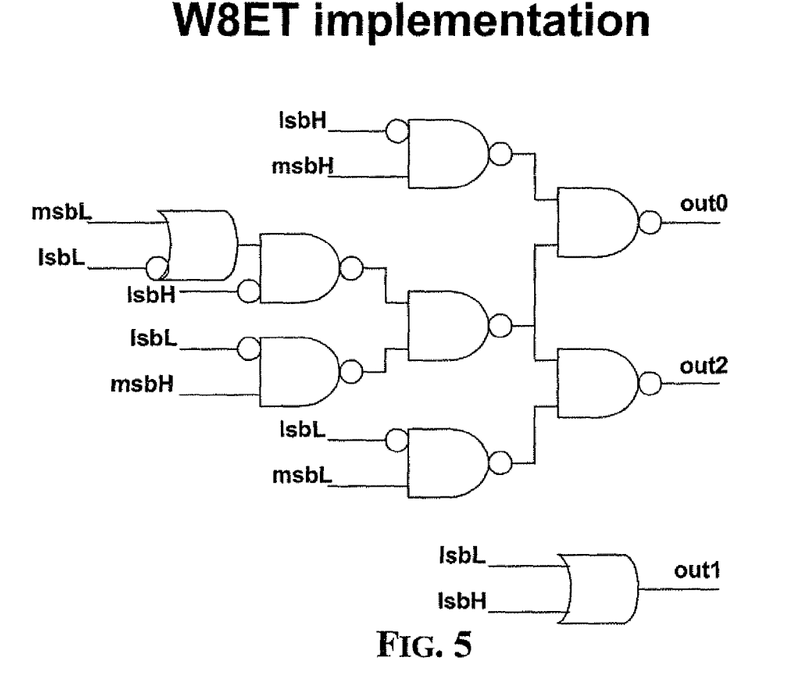
FIG. 5 illustrates a possible architecture of a logic decoding circuit that implements the decoding scheme of FIG. 4, in accordance with the prior art.

Each circuit ML SENSE LOGIC receives at its input two pairs of bits generated by the sense amplifiers of a pair of three-level cells and generates a corresponding triplet of bits OUT2, OUT1, OUT0, as shown in FIG. 4. A possible embodiment of the logic circuit ML SENSE LOGIC is depicted in FIG. 5, as will be appreciated by those skilled in the art without requiring any further description of its functioning.

Figure 6:
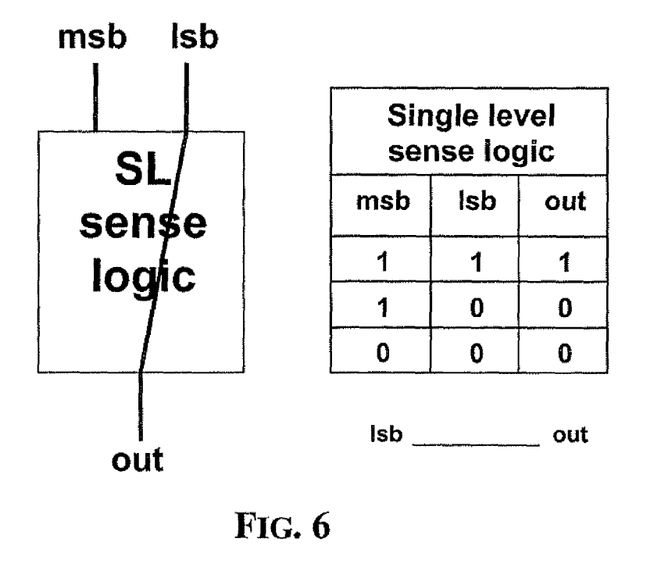
FIG. 6 illustrates a sample decoding of the program levels of a three-level cell to store one bit and the architecture of a relative decoding circuit, in accordance with the prior art.

The logic decoding circuit SL SENSE LOGIC, as depicted in FIG. 6, has a logic signal propagation path such that it outputs the least significant bit LSB of the input pair of bits MSB, LSB. This because it is assumed that the two logic levels of the bits are encoded in the threshold voltage levels A and B of the three-level cell, the third level C remaining unused. Alternatively, if the two levels of the bit to be stored were coded in levels A and C of the three-level cell, the same logic decoding circuit SL SENSE LOGIC would output the most significant bit MSB instead.

A read operation is carried out by reading pairs of three-level cells and decoding the read ternary levels in strings of three bits, according to the coding scheme illustrated in FIG. 4. Programming of the memory is preceded by a coding step for transforming triplets of bits to be stored in the memory into pairs of ternary levels to be programmed in the cells.

The base element of a NOR FLASH memory device is the word (16 bits), that is the amount of information that users can read and program with a single operation. With more recent memory devices it may be possible to read with a single operation more than a single word, typically 4, 8 or 16 words (this lot of information is called "page"), through the steps of: page mode reading, that includes reading the words of a page with an access time shorter than a first access executed to the same page; and burst mode reading, that includes a sequential reading of the memory cells of the array starting from an initial address.

Both read modes are possible by a sensing structure capable of reading and storing the content of a page of the device (in burst mode it is helpful to keep synchronous read frequencies larger than the inner access time of the device).

A simple way of realizing a NOR FLASH memory based on three-level cells may comprise splitting each word in five triplets of bits (10 cells of a three-level memory device, logically associated in pairs) plus an eleventh cell destined to store a single bit that could assume only 2 of the 3 possible levels. Being k the number of words of each page, the read circuit includes k*11 sensing elements.

In a context of multi-level memory devices, using one cell out of 11 for storing a single bit may represent an inefficient use of valuable silicon area. Being the density of information the ratio between the number of stored bits and the number of used cells, it is 16 bits/11 cells=1.4545 bit/cell, if the number of cells (16) of each word of the device is considered, but the theoretically threshold ratio is 3 bits/2 cells=1.5 bit/cell.

A more efficient method of managing a memory with cells of k levels that noticeably reduces the above noted area occupation inefficiency and a related multi-level memory device with k-level cells have now been found. As a matter of fact, strings of N bits to be stored are encoded into corresponding k-level strings having c symbols, and these k-level strings are stored into corresponding groups of c memory cells.

In general, for example in case of three-level memory cells, the number of bits of a word may not be an integer multiple of c and thus one or more bits remain. According to this approach, the remaining bit or bits of a word are stored together with the corresponding remaining bits of other words belonging to the same page, in a dedicated group of c cells with k levels.

According to a first embodiment, there is a method of managing a memory employing three-level cells and a related three-level memory device with a greater information density than known three-level devices. This result is obtained by grouping in triplets the bits of each word of 16 bits and grouping in triplets the remaining bits of the word that comprise the same page, to be stored in respective pairs of three-level cells.

The method may be applied to the case in which the memory cells may assume more than three levels, though in these cases "bit manipulation" may not be guaranteed. For example, in case of memory devices employing six-level cells, it is possible to group the bits of each word in quintuplets and to store each quintuplet in a respective pair of six-level cells. If words include 16 bits, there may be a remaining bit that is conveniently grouped with the remaining bits of other four words in a quintuplet to be stored in a dedicated pair of six-level cells.

DETAILED DESCRIPTION OF THE PREFERRED EMBODIMENTS

A sample embodiment for the case of a three-level cell memory will now be described by referring to FIGS. 7 and 8.

Figure 7:
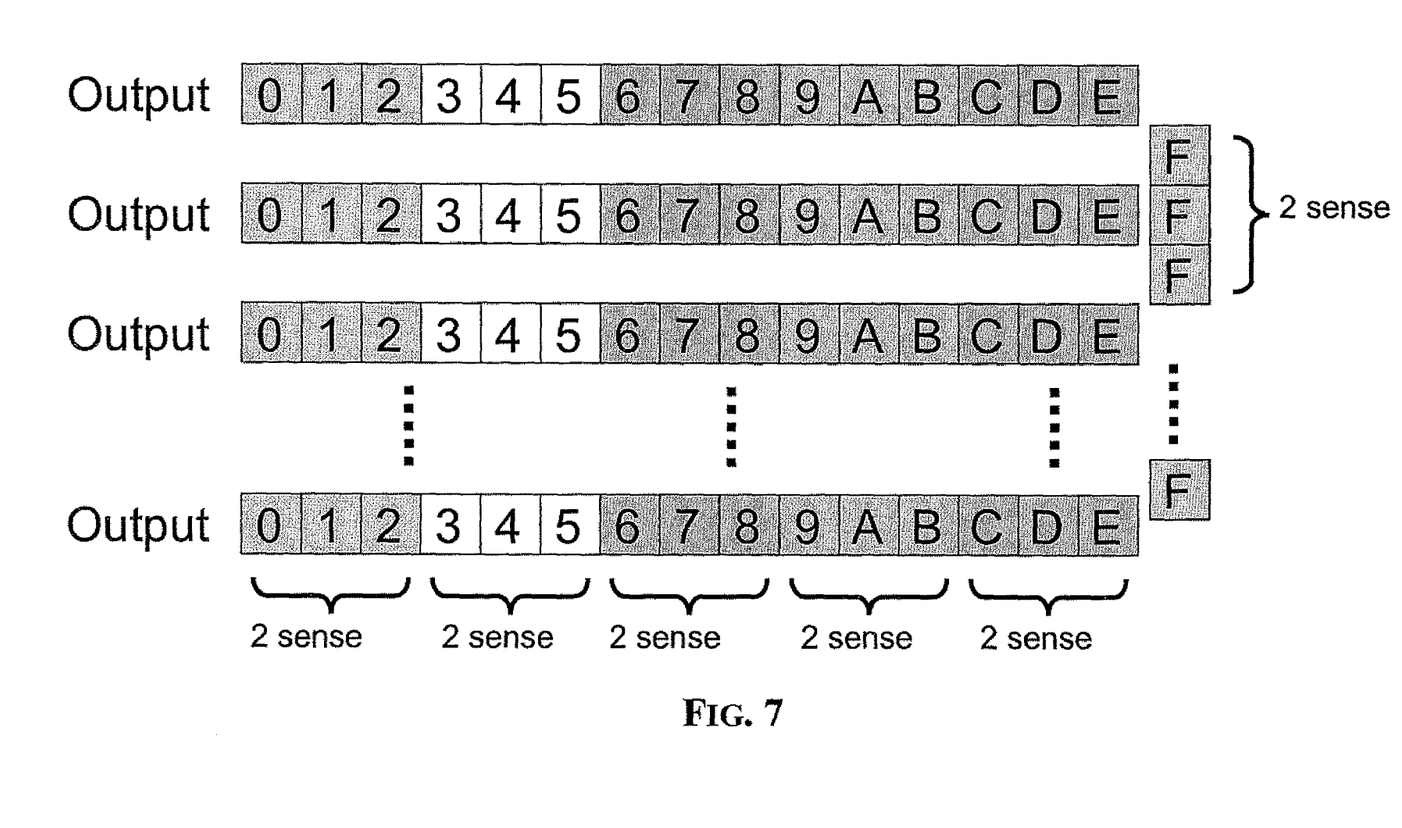
FIG. 7 illustrates how the remaining bits of a word of a same page are grouped in triplets to be stored into respective pairs of three-level cells, in accordance with the present invention.

As illustrated in FIG. 7, it is possible to achieve a significant reduction of silicon area occupied by the array of memory cells by grouping in triplets the bits of each word and grouping the remaining bit of each word with the remaining bits of other two words such to form triplets to be stored in respective pairs of three-level array cells.

An advantage may be in that two cells of three threshold level capability are used for storing the remaining three bits and not three cells with three levels, as according to the method and architectural arrangement disclosed in the above discussed prior patent application. This approach is theoretically applicable to multilevel memories using cells with any number of distinct threshold levels. For the considered case of three-level cells, the number of cells used for storing information of a page of k words decreases from k*11 to k*16/1.5 (rounded up to the smallest larger integer). For example:

k=4: in the known three-level memory devices 44 cells per page are used, while in the proposed three-level memory device 43 cells per page are sufficient;

k=8: in the known three-level memory devices 88 cells per page are used, while in the proposed three-level memory device 46 cells per page are sufficient;

k=16: in the known three-level memory devices 176 cells per page are used, while in the proposed three-level memory device 171 cells per page are sufficient.

With the proposed method of managing a three-level memory device, the silicon area saving is:

$$\frac{k*16/1.5 - k*11}{k*11} = \frac{10.67 - 11}{11} \cong -3\%$$

Differently from the memory device disclosed in the above mentioned Italian patent application No. VA2006A000065, the remaining bit of the word is not decoded by a circuit as depicted in FIG. 6, but with a circuit as depicted in FIG. 4, together with two remaining bits of other two words.

Figure 8:
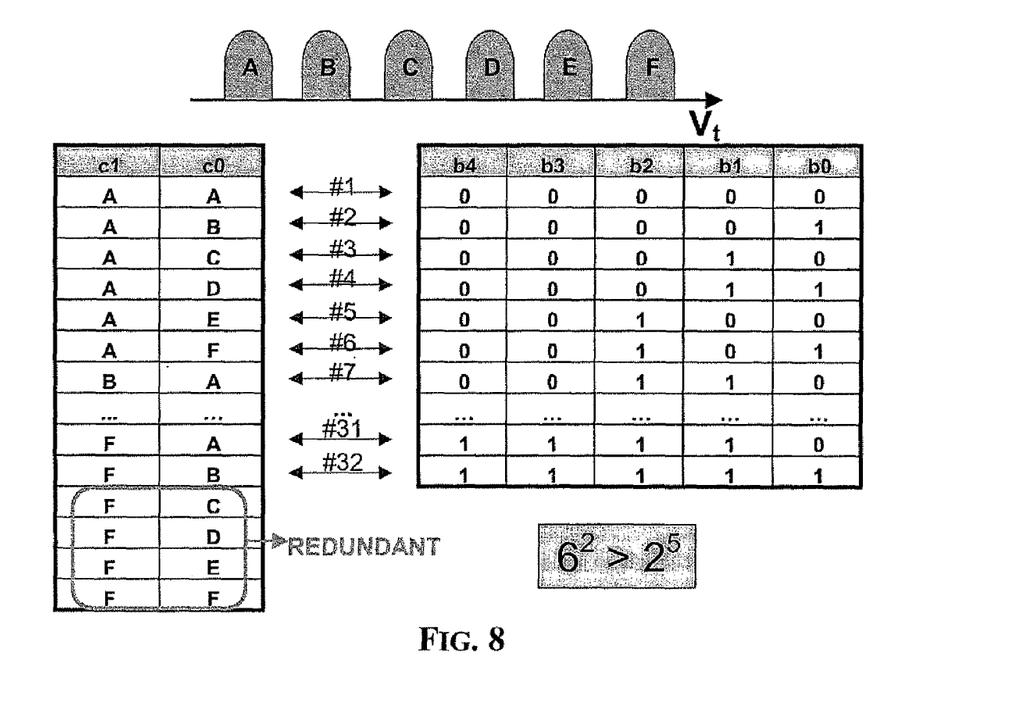
FIG. 8 illustrates how the bits of a same word are grouped in quintuplets to be stored into respective pairs of six-level cells, in accordance with the present invention.

According to another embodiment of the method of this approach, applicable to memory with six-level cells, the bits of each word are grouped in quintuplets and each quintuplet is stored in a respective pair of six-level cells, as schematically illustrated in FIG. 8.

Even in this case, there may be states of the pair of cells that are unused, but they are much less numerous than the used states.

The bits of each word are grouped in quintuplets and, as for three-level memory devices, there is a remaining bit. According to an embodiment, the remaining bit of each word is grouped in a quintuplet together with four remaining bits of other words of the same page and this quintuplet is stored in a respective pair of six-level cells.

As will be evident to any skilled person, the disclosed method can be generalized for a memory having cells that may assume one out of k different levels by grouping the cells in sets of c cells and by storing in each c-tuplet of cells a number N of bits given by the following formula:

$$N = \text{int}[c \cdot \log_2 k]$$

wherein the function int[.] truncates its argument. The number c of cells should be chosen to reduce the number of unused states given by $k^c - 2^N$.

If N is not an integer factor of the number of bits (16) of a word, in each word there may be one or more remaining bits. By adapting what has been described with reference to three-level cells, these remaining bits of the word of each page may be conveniently grouped in sets of N bits to be stored in respective c-tuplets of cells with k levels.

In general, the coding and decoding circuits of the memory may convert strings of N bits into strings with k levels and vice versa using an appropriate code.

The technique of this approach allows to simulate the functioning of a memory with cells with $2^z$ levels using a memory with cells with a number of levels k smaller than $2^z$. This may not be particularly useful when, for technological reasons, it is impractical to realize cells with $2^z$ levels but it is practicable to realize memory devices with k-level cells, being $2^{z-1} < k < 2^z$.

That which is claimed:

1. A memory device having an array of singularly addressable cells with k levels, and organized into pages of a number of words, each to store a string of a number of bits, the device comprising:
    a coding circuit to be input with strings of N bits to be stored, and to generate corresponding k-level strings according to a code;
    a program circuit to be input with the k-level strings and to store them in respective groups of c cells with k levels;
    a read circuit to read data stored in groups of c cells with k levels and to generate corresponding k-level strings;
    a read decoding circuit to be input with k-level strings read from groups of c cells with k levels to generate, according to the code, corresponding strings of N bits;
    the words of each page being grouped in groups of a number of words, each word comprising a number of groups of c cells with k levels, and at least one remaining bit of the word being stored, together with corresponding remaining bits of other words of the page, in a respective group of c cells with k levels.

2. The memory device of claim 1, wherein k levels comprises three levels; wherein the number of bits comprises 16 bits; wherein N bits comprises three bits; wherein groups of c cells comprises groups of two cells; wherein the number of words comprises three words; and wherein the number of groups comprises five groups.

3. The memory device of claim 1, wherein the remaining bits comprise one of a most significant bit or a least significant bit.

4. The memory device of claim 1, wherein said array of singularly addressable cells has a FLASH NOR architecture.

5. The memory device of claim 1, wherein k levels comprises six levels; wherein the number of bits comprises 16 bits; wherein N bits comprises five bits; and wherein groups of c cells comprises groups of two cells.

6. The memory device of claim 5, wherein the number of words comprises five words; and wherein each word comprises three groups of five cells with six levels, the remaining bit of each word being stored, together with corresponding remaining bits of other four words of the page, in a respective pair of six-level cells.

7. A NOR flash device having an array of singularly addressable cells with k levels, and organized into pages of a number of words, each to store a string of a number of bits, the device comprising:
    a coding circuit to be input with strings of N bits to be stored, and to generate corresponding k-level strings according to a code;
    a program circuit to be input with the k-level strings and to store them in respective groups of c cells with k levels;
    a read circuit to read data stored in groups of c cells with k levels and to generate corresponding k-level strings;
    a read decoding circuit to be input with k-level strings read from groups of c cells with k levels to generate, according to the code, corresponding strings of N bits;
    the words of each page being grouped in groups of a number of words, each word comprising a number of groups of c cells with k levels, and at least one remaining bit of the word being stored together with corresponding least significant bits of other words of the page in a respective group of c cells with k levels.

8. The NOR flash device of claim 7, wherein k levels comprises three levels; wherein the number of bits comprises 16 bits; wherein N bits comprises three bits; wherein groups of c cells comprises groups of two cells; wherein the number of words comprises three words; and wherein the number of groups comprises five groups.

9. The NOR flash device of claim 7, wherein k levels comprises six levels; wherein the number of bits comprises 16 bits; wherein N bits comprises five bits; and wherein groups of c cells comprises groups of two cells.

10. The NOR flash device of claim 9, wherein the number of words comprises five words; and wherein each word comprises three groups of five cells with six levels, the remaining bit of each word being stored, together with corresponding remaining bits of other four words of the page, in a respective pair of six-level cells.

11. A NOR flash device having an array of singularly addressable cells with k levels, and organized into pages of a number of words, each to store a string of a number of bits, the device comprising:
    a coding circuit to be input with strings of N bits to be stored, and to generate corresponding k-level strings according to a code;
    a program circuit to be input with the k-level strings and to store them in respective groups of c cells with k levels;
    a read circuit to read data stored in groups of c cells with k levels and to generate corresponding k-level strings;
    a read decoding circuit to be input with k-level strings read from groups of c cells with k levels to generate, according to the code, corresponding strings of N bits;
    the words of each page being grouped in groups of a number of words, each word comprising a number of groups of c cells with k levels, and at least one remaining bit of the word being stored, together with most significant bits of other words of the page in a respective group of c cells with k levels.

12. The NOR flash device of claim 11, wherein k levels comprises three levels; wherein the number of bits comprises 16 bits; wherein N bits comprises three bits; wherein groups of c cells comprises groups of two cells; wherein the number of words comprises three words; and wherein the number of groups comprises five groups.

13. The NOR flash device of claim 11, wherein k levels comprises six levels; wherein the number of bits comprises 16 bits; wherein N bits comprises five bits; and wherein groups of c cells comprises groups of two cells.

14. The NOR flash device of claim 13, wherein the number of words comprises five words; and wherein each word comprises three groups of five cells with six levels, the remaining bit of each word being stored, together with corresponding remaining bits of other four words of the page, in a respective pair of six-level cells.

15. A method of managing a memory device that includes an array of singularly addressable cells with a number of levels k, the method comprising:
    storing strings of N bits by coding them in corresponding k-level strings according to a code, and writing each of the k-level strings to respective groups of c cells with k levels by providing program pulses to the groups of c cells with k levels;

reading strings of N bits by reading respective k-level strings stored in respective groups of c cells with k levels and decoding each read k-level string to a corresponding string of N bits according to the code;

organizing the array of singularly addressable cells into pages of a number of words, each word to store a number of bits, the words of each page being grouped in groups of a number of words, each word comprising a number of groups of c cells with k levels; and storing at least one remaining bit of the word and corresponding remaining bits of other words of the page in a respective group of c cells with k levels.

16. The method of claim 15, wherein k levels comprises three levels; wherein the number of bits comprises 16 bits; wherein N bits comprises three bits; wherein groups of c cells comprises groups of two cells; wherein the number of words comprises three words; and wherein the number of groups comprises five groups.

17. The method of claim 15, wherein k levels comprises six levels; wherein the number of bits comprises 16 bits; wherein N bits comprises five bits; and wherein groups of c cells comprises groups of two cells.

18. The method of claim 17, wherein the number of words comprises five words; wherein the words of each page are grouped in three groups of five cells with six levels; and wherein storing comprises storing the at least one remaining bit of each word and corresponding remaining bits of other four words of the page, in a respective pair of six-level cells.

* * * * *